(12) United States Patent
Hobara et al.

(10) Patent No.: US 7,626,197 B2
(45) Date of Patent: Dec. 1, 2009

(54) SEMICONDUCTOR DEVICE INCLUDING CONDUCTIVE NETWORK OF PROTECTIVE FILM MOLECULES AND FINE PARTICLES

(75) Inventors: Daisuke Hobara, Kanagawa (JP); Shinichiro Kondo, Tokyo (JP)

(73) Assignee: Sony Corporation, Tokyo (JP)

( * ) Notice: Subject to any disclaimer, the term of this patent is extended or adjusted under 35 U.S.C. 154(b) by 117 days.

(21) Appl. No.: 11/231,062

(22) Filed: Sep. 19, 2005

(65) Prior Publication Data
US 2006/0076556 A1 Apr. 13, 2006

(30) Foreign Application Priority Data
Sep. 29, 2004 (JP) ............................ P2004-283913

(51) Int. Cl.
*H01L 35/24* (2006.01)
*H01L 51/00* (2006.01)
(52) U.S. Cl. ................................. 257/40; 257/E51.015
(58) Field of Classification Search .................. 257/40; 438/99
See application file for complete search history.

(56) References Cited
U.S. PATENT DOCUMENTS
2005/0056828 A1 3/2005 Wada et al.
2005/0148179 A1* 7/2005 Hirai et al. .................. 438/689

FOREIGN PATENT DOCUMENTS
| JP | 2003-301116 | 10/2003 |
| JP | 2004-088090 | 1/2004 |
| JP | 2004-006827 | 3/2004 |
| WO | WO 03089515 A1 * | 10/2003 |

OTHER PUBLICATIONS

C. D. Dimitrakopoulos et al., Adv. Mater., 14, 99 (2002).
C. D. Dimitrakopoulos et al., IBM. J. Res. & Dev., 45, 11 (2001).
M. D. Musick et al., Chem. Mater., 9, 1499 (1997).
M. D. Musick et al., Chem. Mater., 12, 2869 (2000).

* cited by examiner

*Primary Examiner*—Kenneth A Parker
*Assistant Examiner*—Anthony Ho
(74) *Attorney, Agent, or Firm*—K&L Gates LLP

(57) ABSTRACT

A semiconductor device and method for manufacturing the same are provided. The semiconductor device includes conductor or semiconductor fine particles, and organic semiconductor molecules bonded to the fine particles to form a conductive path, the conductivity of the conductive path being controlled by an electric field. In the semiconductor device, protective film molecules bonding to the adjacent fine particles bond to each other to form the organic semiconductor molecules which connect the fine particles to each other.

7 Claims, 11 Drawing Sheets

STEP 1

STEP 2

STEP 3

STEP 4

STEP 5

STEP 6

STEP 7

M = Ru, Fe, Co, Mn, etc.

π–π STACKING

HYDROGEN BOND

DIRECTION OF ELECTRON FLOW

STEP 1

STEP 2

STEP 3

STEP 4

STEP 5

STEP 6

STEP 7

US 7,626,197 B2

SEMICONDUCTOR DEVICE INCLUDING CONDUCTIVE NETWORK OF PROTECTIVE FILM MOLECULES AND FINE PARTICLES

CROSS REFERENCE TO RELATED APPLICATIONS

The present application claims priority to Japanese Patent Application No. 2004-283913 filed in the Japan Patent Office on Sep. 29, 2004, the entire contents of which being incorporated herein by reference.

BACKGROUND

The present invention relates to an electric conductor including a conductive path composed of conductor or semiconductor fine particles and organic semiconductor molecules, a method for producing the same, a semiconductor device using the electric conductor, and a method for producing the semiconductor device.

Thin film transistors (abbreviated to "TFTS" hereinafter) are widely used as switching elements in electronic circuits, particularly active matrix circuits of displays or the like.

At present, most of the TFTs are Si-based inorganic transistors each using amorphous silicon (a-Si) or polycrystalline silicon (poly-Si) for a semiconductor layer (channel layer). These transistors are produced by a process using plasma CVD (Chemical Vapor Deposition) for forming a semiconductor layer, and thus the process is a high cost process. In addition, heat treatment is performed at a high temperature of about 350° C., thereby increasing the process cost and causing limitation of a substrate.

In recent years, organic semiconductor transistors using organic semiconductor materials have been actively developed because these transistors can be produced by a low cost process such as spin coating or dipping at a low temperature, and also a film can be formed on a flexible substrate with no heat resistance, such as a plastic substrate.

However, only a value of $10^{-3}$ to 1 $cm^2/Vs$ has been attained as mobility, which is a characteristic index of TFTs, by using organic semiconductor materials (C. D. Dimitrakopoulos et al., Adv. Mater., 14, 99 (2002)). This value is lower than several $cm^2/Vs$ of a-Si and about 100 $cm^2/Vs$ of poly-Si, and does not reach a mobility of 1 to 3 $cm^2/Vs$ for display TFTs. Therefore, an improvement of mobility becomes a great problem in developing organic semiconductor materials.

The mobility of an organic semiconductor material is determined by intramolecular charge transfer and intermolecular charge transfer. The intramolecular charge transfer can be produced by a conjugated system formed due to delocalization of $\pi$ electrons. The intermolecular charge transfer is produced by conduction due to intermolecular bonding, conduction due to molecular orbital overlap by Vander Waals force, or hopping conduction through an intermolecular trapping level.

In this case, when intramolecular mobility is denoted by "$\mu$-intra", mobility due to intermolecular bonding is denoted by "$\mu$-inter", and mobility due to intermolecular hopping conduction is denoted by "$\mu$-hop", the following relation is established:

$\mu$-intra$\geq\mu$-inter$>\mu$-hop

In an organic semiconductor material, the entire mobility is limited by slow charge transfer between molecules, thereby decreasing charge mobility.

For example, when a thin film of an organic semiconductor material, e.g., pentacene, is formed by vapor deposition, in order to improve mobility, the rate of vapor deposition is minimized, and the substrate temperature is suppressed to room temperature to improve molecular orientation, thereby achieving a mobility of 0.6 $cm^2/Vs$ (C. D. Dimitrakopoulos et al., IBM. J. Res. & Dev., 45, 11 (2001)).

This is intended to improve mobility by improving the crystallinity of the material and suppressing intermolecular hopping conduction. Although the mobility is slightly improved, the entire mobility is still limited by intermolecular mobility, thereby causing difficulty in achieving satisfactory mobility.

Other attempts have been made to improve electric properties by combining an organic semiconductor material with another material.

For example, Japanese Unexamined Patent Application Publication No. 2003-301116 discloses an example in which an organic semiconductor material includes a mixture of a conjugated polymer and an organometallic complex. The conjugated polymer is a polymer in which bonds are conjugated in respective repeat units, which constitute a polymer main chain, and conjugated between the respective repeat units. However, in the mixture, a chemical bond is not formed between the conjugated polymer and the organometallic complex, and thus conductivity is not so improved.

Also, Japanese Unexamined Patent Application Publication No. 2004-6827 discloses an example in which a conductive region including a conductive material is provided in an organic semiconductor layer while avoiding short-circuit between a source electrode and a drain electrode. The conductive region is provided for shortening the effective channel length, not for improving the electric characteristics of the organic semiconductor material, such as mobility, and a chemical bond is not formed between the organic semiconductor and the conductive material.

Furthermore, Japanese Unexamined Patent Application Publication No. 2004-88090 discloses a semiconductor device including conductor or semiconductor fine particles and organic semiconductor molecules bonded to the fine particles to form a network-type conductive path so that the conductivity of the conductive path can be controlled by an electric field, and a method for producing the semiconductor device.

FIG. 9A is a sectional view of the insulated-gate field-effect transistor disclosed in Japanese Unexamined Patent Application Publication No. 2004-88090, and FIG. 9B is an enlarged view of the principal portion thereof. In the field-effect transistor, fine particles 109 of gold or the like are bonded in a network form to organic semiconductor molecules 112 of 4,4'-diphenyldithiol or the like to form a channel layer 108 between a source electrode 104 and a drain electrode 105, so that the carrier transfer in the network aggregate is controlled by the gate voltage applied to a gate electrode 102.

As shown in FIG. 9B, in the aggregate, the organic semiconductor molecules 112 are bonded to the fine particles 109 through functional groups at both ends of each of organic semiconductor molecules 112 so that the fine particles 109 and the organic semiconductor molecules 112 are alternately connected to form a conductive path in which the conductive paths in the fine particles 109 and the conductive paths in the organic semiconductor molecules 112 are connected together. Since a plurality of organic semiconductor molecules 112 can bond to each fine particle 109, a two-dimensional or three-dimensional network conductive path is formed as a whole.

The conductive path does not include intermolecular electron transfer, which causes low mobility in a related-art organic semiconductor, and electron transfer in an organic semiconductor molecule is produced through a conjugated system formed along the molecular skeleton. Therefore, high mobility is expected.

FIGS. 10A to 11G show a flow chart of a process for manufacturing the insulated-gate field-effect transistor shown in FIGS. 9A and 9B. Description will be made on the assumption that the fine particles 109 are gold fine particles, and the organic semiconductor molecules 112 are molecules of 4,4'-biphenyldithiol.

Step 1

First, as shown in FIG. 10A, the gate electrode 102, the gate insulating film 103, the source electrode 104, and the drain electrode 105 are formed on a substrate 101 such as a plastic substrate. For example, the electrodes 102, 104, and 105 are formed by vapor deposition of gold, and the gate insulating film 103 is formed by spin-coating a polymethyl methacrylate (PMMA) solution and then evaporating the solvent.

Step 2

Next, a surface of a region in which the channel layer 108 is to be formed is immersed in, for example, a toluene or hexane solution of 3-aminopropyltrimethoxysilane (APTMS) used as solder molecules 107 and washed with the solvent to replace the solution with the solvent, and then the solvent is evaporated to form a molecular solder layer 106 as an underlying layer for fixing only one layer of the gold fine particles 109, as shown in FIG. 10B. APTMS can bond to the gate insulating film 103 through a silanol group at one of the ends, and also can bond to each gold fine particle 109 through an amino group at the other end. Therefore, each of the solder molecules 107 is a molecule which can bond to the gate insulating film 103 at one of the ends and also bond to each fine particle 109 at the other end, and thus has the function to fix each fine particle 109 to the gate insulating film 103.

Step 3

Next, the substrate 101 is immersed in a dispersion (concentration: several mM) of the gold fine particles 109 in a solvent such as toluene, chloroform, or the like for several minutes to several hours, and then the solvent is evaporated. As a result, as shown in FIG. 10C, the gold fine particles 109 are fixed to the surface of the molecular solder layer 106 on the substrate 101 to form a gold fine particle layer 109a including the gold fine particles 109 on the molecular solder layer 106. In this step, only one gold fine particle layer 109a is fixed to the molecular solder layer 106 through the amino groups. Excessive gold fine particles 109 not fixed to the molecular solder layer 106 are washed out.

The gold fine particles 109 are colloidal particles having a particle size of 10 nm or less. In order to stably disperse the gold fine particles 109 in the solvent such as toluene, chloroform, or the like, protective film molecules are adhered to the fine particles 109 to coat each particle 109 with a protective film 110, for preventing aggregation and precipitation of the fine particles 109. The gold fine particles 109 each coated with the protective film 10 are fixed to the molecular solder layer 106. The solder molecules 107 bond to the gold fine particles 109 by substituting some of the protective film molecules. However, as shown in FIG. 10C, most of the protective film molecules remain to bond to the gold fine particles 109.

Step 4

Then, the substrate 101 is immersed in a toluene solution (concentration: several mM or less) of 4,4'-biphenyldithiol and washed with the solvent to replace the solution with the solvent, and then the solvent is evaporated. In this step, as shown in FIG. 10D, the 4,4'-biphenyldithol molecules 112 react with the gold fine particles 109 through the terminal thiol groups —SH of the molecules to substitute the protective film molecules which form the protective films 110, thereby bonding to the surfaces of the gold fine particles 109. In this case, a plurality of 4,4'-biphenyldithiol molecules 112 bond to the surface of each gold fine particle 109 so as to surround the particle 109. Since some of the 4,4'-biphenyldithiol molecules 112 bonding to one of the particles 109 bond to other ones of the gold fine particles 109 through the thiol group at the other end of each of the molecules to form a first channel layer 108a in which the gold fine particles 109 are connected in a two-dimensional network through the 4,4'-diphenyldithiol molecules 112.

Since many unreacted thiol groups of the 4,4'-biphenyldithiol molecules 112 remain on the surface of the channel layer 108a, the surface of the channel layer 108a has strong bonding force to the gold fine particles 112.

Step 5

Next, as shown in FIG. 11E, the substrate 101 is immersed in a dispersion of the gold fine particles 109 in a solvent such as toluene, chloroform, or the like for several minutes to several hours, and then the solvent is evaporated as in step 3. As a result, the gold fine particles 109 are fixed and bonded to the surface of the first channel layer 108a to form a second gold fine particle layer 109b. In this step, the gold fine particles 109 in the second layer are connected to the gold fine particles 109 in the first layer through the 4,4'-biphenyldithiol 112. Also, the fine particles 109 in the first layer which are connected to the same gold fine particle 109 in the second layer are connected together indirectly through the same gold fine particle 109 in the second layer, so that the gold fine particles 109 are connected together in a three-dimensional form. Excessive gold fine particles 109 not fixed to the channel layer 108a are washed out.

Like in Step 3, in order to prevent aggregation of the gold fine particles 109, the gold fine particles 109 are each coated with the protective film 110 and fixed to the channel layer 108a. Although unreacted thiol groups of the 4,4'-biphenyldithiol molecules 112 remaining on the surface of the channel layer 108a bond to the gold fine particles 109 by substitution of the protective film molecules, most of the protective film molecules remain to bond to the gold fine particles 109, as shown in FIG. 11E.

Step 6

Then, like in Step 4, the substrate 101 is immersed in a solution of the 4,4'-diphenyldithiol 112 in toluene at a concentration of several mM or less and washed with the solvent to replace the solution with the solvent, and then the solvent is evaporated. As a result, as shown in FIG. 11F, many 4,4'-biphenyldithiol molecules 112 bond to each gold fine particle 109 so as to envelope the particle 109, thereby forming a second channel layer 108b in which the gold fine particles 109 are connected to each other through the 4,4'-biphenyldithiol molecules 112.

Thereafter, steps 5 and 6 are repeated several times to form a channel layer 108 each time in which a three-dimensional network conductive path is formed, as shown in FIG. 11G. The channel layer 108 having a desired thickness can be formed by appropriately selecting the number of repeats. The above-described method for forming the gold fine particle layer is referred to M. D. Musick et al., Chem. Mater., 9, 1499 (1997) and Chem. Mater., 12, 2869 (2000).

The conductive path disclosed in Japanese Unexamined Patent Application Publication No. 2004-88090 does not include intermolecular electron transfer, and thus mobility is not limited by the intermolecular electron transfer. Therefore, the mobility of the conductive path (in the axial direction of a molecular) along the main chain of an organic semiconductor molecule, for example, high intramolecular mobility due to nonlocalized π electrons, can be maximized.

However, in order to prevent aggregation and precipitation of the fine particles 109 of gold or the like in the process for forming the conductive path, the fine particles 109 are coated with the protective film molecules for preventing aggregation in formation of a colloidal solution of the fine particles. In the method for forming a semiconductor device disclosed in Japanese Unexamined Patent Application Publication No. 2004-88090, therefore, a dispersion of the fine particles 109 each coated with the protective film 110 in the solvent is applied to the substrate to form the fine particle layers 109a and 109b and fix the fine particles 109 to the substrate, as shown in FIGS. 10C and 11E. Then, as shown in FIG. 10D and 11F, the organic semiconductor molecules 112 each having functional groups at both ends, which can strongly bond to the fine particles 109, are reacted to substitute the protective film molecules with the organic semiconductor molecules 112 and to connect the fine particles 109 to each other through the organic semiconductor molecules 112, thereby forming a network conductive path including the final particles 109 and the organic semiconductor molecules 112.

In order to achieve high efficiency-networking of fine particles which influences the performance of a semiconductor device, there are the following conditions:

(1) In order to increase the ratio of linkage between the fine particles 109 through the organic semiconductor molecules 112 which substitute the protective film molecules, the distance between the fine particles 109 in each of the fine particle layers 109a and 109b is controlled to at least the maximum length or less of the organic semiconductor molecules 112 and preferably a length desirable for linkage through the organic semiconductor molecules 112, for example, about the natural length of the organic semiconductor molecules 112.

(2) In order to effectively promote substitution reaction, the protective film molecules used have smaller bonding force to the fine particles 109 than that to the organic semiconductor molecules 112.

However, it is difficult to precisely control the distance between the fine particles in each of the fine particle layers 109a and 109b. Also, when the bonding force of the protective film molecules to the fine particles 109 is excessively small, the function to protect the fine particles 109 becomes insufficient. Therefore, in order to achieve the sufficient protective function and satisfy the above-described condition (2), the bonding ability of the protective film molecules for the fine particles 109 is greatly limited, thereby causing difficulty in finding appropriate protective film molecules. As a result, the method disclosed in Japanese Unexamined Patent Application Publication No. 2004-88090 has difficulty in achieving high-efficiency networking of fine particles.

SUMMARY

According to the present invention, it is desirable to provide a semiconductor device including fine particles and organic semiconductor molecules bonded to the fine particles to form a conductive path, conductivity being controlled by an electric field, and also provide a method for manufacturing the semiconductor device. It is also desirable to provide a semiconductor device and a manufacturing method therefore, which do not include substitution of protective film molecules bonded to fine particles in order to prevent aggregation of the fine particles in formation of a colloidal solution of the fine particles.

According to an embodiment of the present invention, there is provided a semiconductor device including conductor or semiconductor fine particles and organic semiconductor molecules bonded to the fine particles to form a conductive path, conductivity being controlled by an electric field, wherein protective film molecules bonded to the respective adjacent fine particles are bonded to each other to form the organic semiconductor molecules which connect the fine particles to each other. According to another embodiment of the present invention, there is provided a method for manufacturing a semiconductor device including conductor or semiconductor fine particles and organic semiconductor molecules bonded to the fine particles to form a conductive path, the conductivity of the conductive path being controlled by an electric field, the method including bonding protective film molecules, which produce the organic semiconductor molecules, to the fine particles, and then disposing a plurality of the fine particles and forming bonding between the protective film molecules of the adjacent fine particles to produce the organic semiconductor molecules which connect the fine particles to each other.

According to the above-described embodiment of the present invention, the method for manufacturing the semiconductor device including the fine particles and the organic semiconductor molecules bonded to the fine particles to form the conductive path, conductivity being controlled by an electric field, includes bonding the protective film molecules, which produce the organic semiconductor molecules, to the fine particles, and then disposing a plurality of the fine particles and forming bonding between the protective film molecules of the adjacent fine particles to produce the organic semiconductor molecules which connect the fine particles to each other. Therefore, the bonding is formed in each protective film molecule or between the respective protective film molecules to produce molecules having the properties of organic semiconductor molecules, and thus the semiconductor device can be manufactured by a simple process.

Also, the step of substituting the protective film molecules of the fine particles with the organic semiconductor molecules and connecting the fine particles to each other through the organic semiconductor molecules is not performed, thereby producing the following advantages (1) and (2):

(1) As described above, in the method of Japanese Unexamined Patent Application Publication No. 2004-88090, in order to achieve high-efficiency networking of the fine particles, the distance between the fine particles is preferably controlled to, for example, about the natural length of the organic semiconductor molecules, before substitution. However, in the manufacturing method according to the present invention, the distance between the fine particles is not finely controlled. Namely, the closer to each other the protective film molecules which bond to the two adjacent fine particles, the more easily the bonding is formed. Therefore, even when the fine particles are simply arranged in a state close to a close-packed state before the bonding is formed, the conductive path highly networked by the fine particles and the organic semiconductor molecules can be automatically formed.

(2) The protective film molecules are not substituted, and thus molecules having functional groups with very low bonding force to the fine particles can be used as the protective film molecules.

Therefore, the method for manufacturing the semiconductor device according to the present invention can easily produce the semiconductor device including the conductive path highly networked by the fine particles and the organic semiconductor molecules, as compared with the method of Japanese Unexamined Patent Application Publication No. 2004-88090.

The semiconductor device according to the present invention is manufactured by the manufacturing method according to the present invention and includes the organic semiconductor molecules corresponding to the manufacturing method. Therefore, the semiconductor device has high mobility due to the highly networked conductive pat.

Additional features and advantages are described herein, and will be apparent from, the following Detailed Description and the figures.

DETAILED DESCRIPTION

Figure 1:
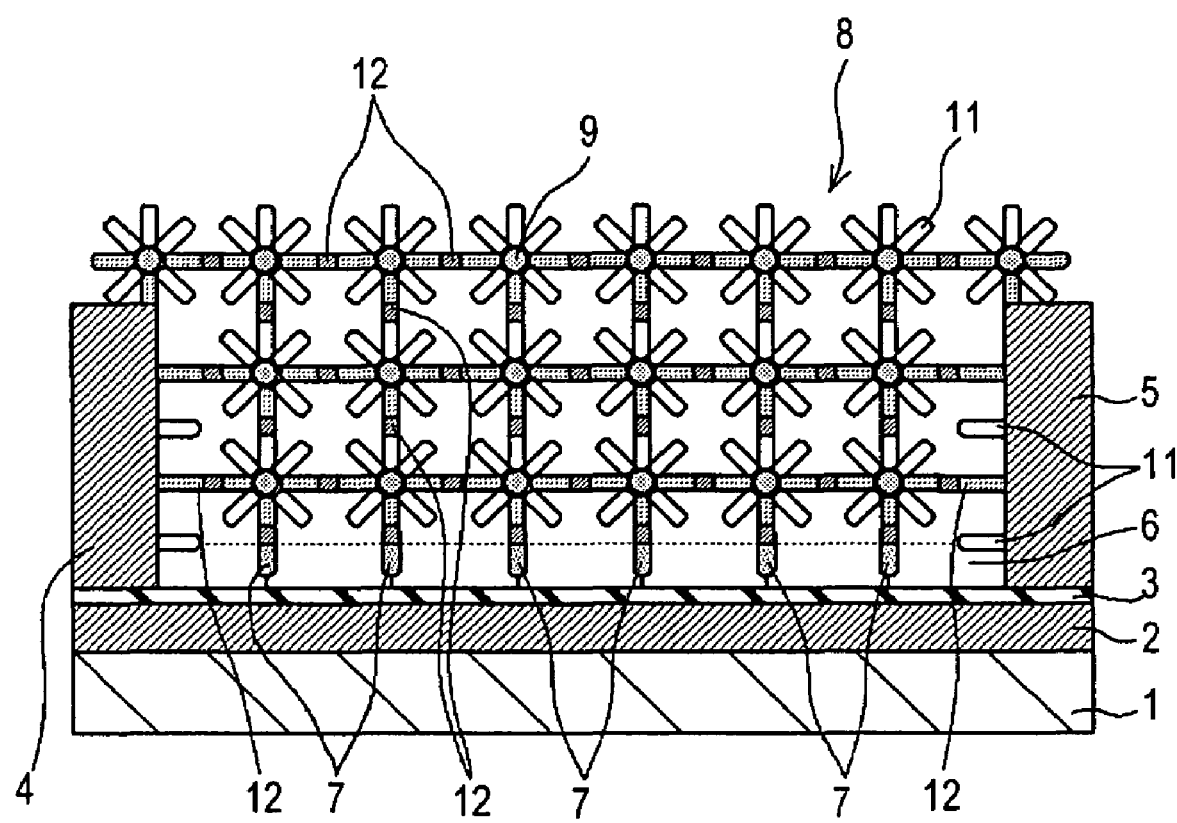
FIG. 1 is a schematic sectional view showing an example of an insulated-gate field-effect transistor according to a first embodiment of the present invention.

According to the present invention, molecules which form a protective film are preferably used as protective film molecules for preventing aggregation of fine particles before bonding is formed. In this case, the protective film may be composed of only the protective film molecules or the protective film molecules and other protective film molecules. For example, when the other protective film molecules mainly have the function to protect the fine particles so as to complement the function of the main protective film molecules to protect the fine particles, the protective film molecules can be selected from a wider range of molecules.

As the protective film molecules, molecules each having a bonding site bonding to a fine particle and a non-bonding site not bonding to a fine particle are preferably used so that bonding is formed between the non-bonding sites. Also, as the protective film molecules, molecules each having a π-bond conjugated system in the skeleton thereof are preferably used.

More specifically, for example, an organic molecule used as each protective film molecule is chemically bonded to a fine particle through a first functional group present at one of the ends, and the above-described bonding is formed through a second functional group present at the other end of the organic molecule. Also, the organic semiconductor molecules and the fine particles are alternately bonded through the first functional groups bonded to the fine particles to form a network-type conductive path.

In this case, each protective film molecule is represented by X—R—Y wherein X represents the first functional group at the site bonding to a fine particle, Y represents the second functional group at the non-bonding side not bonding to a fine particle and forming the bonding between the protective film molecules, and R represents the other portion such as the molecular skeleton or the like.

Each of the protective film molecules preferably has at least one functional group X, and the functional group X is preferably a thiol group (—SH), an amino group (—NH$_2$), an isocyano group (—NC), a thioacetoxyl group (—SCOCH$_3$), or a carboxyl group (—COOH).

The protective film molecules bond to the fine particles through groups X to form the protective films for preventing aggregation of the fine particles before the bonding is formed, and the fine particles chemically and electrically bond to the protective film molecules. After the bonding is formed, the organic semiconductor molecules produced from the protective film molecules bond to the fine particles through groups X present at both ends to connect the fine particles to each other. As a result, the fine particles and the organic semiconductor molecules chemically and electrically bond to each other.

Examples of portion R of each protective film molecule, such as the molecular skeleton, include alkanes, alkynes, alkenes, and aromatic groups. However, groups having a π-bond conjugated system are preferred. The π-bond conjugated system present in portion R is inherited to each of the organic semiconductor molecules produced from the protective film molecules to form a conductive path in each organic semiconductor molecule.

Also, the π-bond conjugated system is preferably formed by the bonding in each organic semiconductor molecule. Each of the protective film molecules has at least one second functional group Y so that the protective film molecules bond together through groups Y to produce the organic semiconductor molecules. In this case, when an atomic group formed from group Y due to the above-described bonding forms a π-bond conjugated system, this π-bond conjugated system is linked to a π-bond conjugated system present in portion R to form a π-bond conjugated system over the organic semiconductor molecule. As a result, the π-bond conjugated system can be utilized to a maximum extent as the conductive path in the organic semiconductor molecule, thereby realizing high mobility.

The bonding is preferably formed by at least one reaction selected from the group consisting of condensation reaction, substitution reaction, coupling reaction, complex forming reaction, addition reaction, hydrogen bond forming reaction, and π-π stacking reaction.

The reaction is preferably produced by at least one process selected from the group consisting of heating, light irradiation, introduction of a reaction initiator or metal ions in the system, and removal of a solvent. In optical chemical reaction, a light irradiation region is optically narrowed to cause reaction only of the fine particles present in a specified region. Unreacted fine particles may be washed out.

As the protective film molecules, molecules having the properties of organic semiconductor molecules are preferably used. The protective film molecules themselves preferably have the properties of organic semiconductor molecules. In particular, when a new π-bond conjugated system is not formed at the bonding site because the bonding is formed by hydrogen bond forming reaction or π-stacking reaction, the protective film molecules themselves preferably have the properties of organic semiconductor molecules.

The conductive path preferably includes one layer or a plurality of layers of an aggregate of the fine particles and the organic semiconductor molecules.

Specifically, the step of forming the bonding is performed once after a layer of the fine particles is formed, thereby forming a single layer of the aggregate. This step is repeated two times or more to form a plurality of layers. In this way, a channel layer including the conductive path is repeatedly formed. The channel layer having a desired thickness can be formed by appropriately selecting the number of repeats.

Alternatively, the step of forming the bonding may be preformed after a plurality of fine particles layers is formed, thereby forming a plurality of layers of the aggregate. When the bonding is formed by reaction without using a reactive member other than groups Y, for example, when reaction is activated by heating, a plurality of fine particle layers may be formed before the bonding is formed so that the above-described bonding is formed over the entire region of the plurality of layers to network the fine particles over the entire region at a time. In this case, a semiconductor device can be easily formed on a substrate having high irregularity or a curved substrate.

When a gate insulating film has a surface with low affinity (adhesiveness) for the fine particles, an underlying layer having high adhesiveness to the fine particles is preferably formed on the surface of the gate insulating film, and the fine particle layer is formed on the underlying layer. The underlying layer is composed of molecules each having the function to bond to, for example, the gate insulating film and an electrode at one of the ends and bond to the fine particle at the other end and fix the fine particle to the gate electrode film and the electrode. The need for the underlying layer is determined depending on the method for forming the fine particle layer and the strength of interaction between the protective films of the fine particles and the surface of the gate insulating film.

Furthermore, preferably, a channel region having the conductive path is formed, and source and drain electrodes are provided on both sides of the channel region. In addition, a gate electrode is preferably provided between both electrodes to form an insulated-gate field-effect transistor. This structure can be operated as an optical sensor or the like using a dye, which has light absorptivity for light near visible light, as organic semiconductor molecules each having a conjugated system.

The fine particles are preferably fine particles of the conductor such as gold, silver, or platinum, or the semiconductor such as cadmium sulfide, cadmium selenide, or silicon, and the particle size is preferably 10 nm or less.

Preferred embodiments of the present invention will be described in detail below with reference to the drawings.

FIRST EMBODIMENT

In the first embodiment, the fine particles are linked together by chemical reaction of the protective film molecules to form a network in the conductive path. Each protective film molecule X—R—Y has the first functional group X strongly bonding to a fine particle at one of the ends, and the second function group Y at the other. The second functional group Y of each protective film molecule X—R—Y bonding to a fine particle through the group X is subjected to condensation reaction with the second functional group Y of the protective film molecule bonding to an adjacent fine particle to produce an organic semiconductor molecule X—R—Y'—R—X which connects the fine particles to each other according to the following equation:

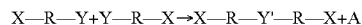

In the above formula, Y' represents the residue of the group Y, and A represents a small molecule of water or the like. Examples of such reaction include aldol condensation in which the second functional group Y is an aldehyde group, and Claisen condensation in which the second functional group Y is an ester bond.

FIG. 1 is a schematic sectional view showing an example of an insulated-gate field-effect transistor according to the first embodiment. This figure shows a bottom-gate device structure commonly used as a TFT. In the field-effect transistor, a channel layer 8 is formed between a source electrode 4 and a drain electrode 5, the channel layer 8 having a network formed by fine particles 9 of gold or the like and organic semiconductor molecules 12.

In the channel layer 8, the organic semiconductor molecules 12 bond to the fine particles 9 through functional groups X at both ends of each organic semiconductor molecule 12 so that the fine particles 9 and the organic semiconductor molecules 12 are alternately linked to form a conductive path in which conductive paths in the fine particles 9 and conductive paths in the organic semiconductor molecules 12 are connected to each other. Since many organic semiconductor molecules 12 can bond to each fine particle 9, a two-dimensional or three-dimensional network-type conductive path is formed as a whole. In the channel layer 8, electron conduction is produced through the network-type conductive path, and the conductivity of the channel layer 8 is controlled by the voltage applied to a gate electrode 2.

The conductive path does not include intermolecular electron transfer which causes low mobility in a related-art organic semiconductor, and electron transfer in an organic semiconductor molecule is produced through a conjugated system formed therein. Therefore, high mobility can be expected.

The embodiment will be described in further detail below.

Examples of a substrate 1 include a silicon substrate, plastic substrates such as substrates of polyimide, polycarbonate, and polyethylene terephthalate (PET), a glass substrate, and a quartz substrate. By using the plastic substrate, a semiconductor device having a flexible shape, such as a display with a curved surface, can be produced.

Like in application to a display, a transistor formed on the substrate 1 may be used as a monolithic integrated circuit in which a plurality of transistors is integrated on each substrate 1, or may be used as a discrete component including an individual isolated transistor.

As a material for the gate electrode 2, a conductive substance, for example, a conductive polymer, gold (Au), platinum (Pt), aluminum (Al), nickel (Ni), or titanium (Ti), or a combination thereof may be used.

As a material for the gate insulating film 3, for example, silicon oxide (SiO$_2$), polymethyl methacrylate (PMMA), spin-on-glass (SOG), silicon nitride (Si$_3$N$_4$), or a metal oxide high dielectric insulating film, or a combination thereof may be used.

As a material for the source electrode 4 and the drain electrode 5, a conductive substance, for example, gold (Au), palladium (Pd), platinum (Pt), chromium (Cr), nickel (Ni), or a conductive polymer, or a combination thereof may be used.

In this embodiment, the treatment temperature in the manufacturing process can be suppressed to 200° C. or less, and thus organic compounds can be used as all of these materials.

The channel layer 8 includes an aggregate in which the fine particles 9 and the organic semiconductor molecule 12 are bonded in a network form, and thus the carrier transfer is controlled by the gate voltage applied to the gate electrode 2.

The fine particles 9 have a particle size of 10 nm or less and may be formed using a material, for example, a conductor such as gold (Au), silver (Ag), or platinum (Pt), or a semiconductor such as cadmium sulfide (CdS), cadmium selenide (CdSe), or silicon (Si).

The organic semiconductor molecules 12 each have a molecular skeleton with a π-bond conjugated system and also have a first functional group X that can chemically bond to one of the fine particles 9, such as a thiol group (—SH), an amino group (—$NH_2$), an isocyano group (—NC), a thioacetoxyl group (—$SCOCH_3$), or a carboxyl group (—COOH). A thiol group, an amino group, an isocyano group, and a thiacetoxyl group are functional groups bonding to conductor fine particles of gold or the like, and a carboxyl group is a functional group bonding to semiconductor fine particles.

In a region in which the channel layer 8 is formed, a molecular solder layer 6 is formed as an underlying layer for fixing one layer of the fine particles 9 to the surface. The solder molecules 7 used as molecules functioning to fix the fine particles to the gate insulating film 3 or the source electrode 4 and the drain electrode 5 have functional groups which can form bonding to the fine particles 9 or the protective film molecules 11 bonding to the fine particles 9 and functional groups which can bond to the gate insulating film 3.

For example, when the fine particles 9 are composed of gold, and the molecular solder layer 6 is formed on the gate insulating film 3 composed of silicon oxide $SiO_2$, examples of a compound used for the solder molecules 7 include N-(2-aminoethyl)-3-aminopropylmethyldimethoxysilane, N-(2-aminoethyl)-3-aminopropyltrimethoxysialne, N-(2-aminoethyl)-3-aminopropyltriethoxysilane, 3-aminopropyl trimethoxysialne, 3-aminopropyltriethoxysilane, 3-mercaptopropyltrimethoxysilane, and 3-mercaptopropylmethyldimethoxysilane.

In the step of forming the channel layer 8, one layer of the fine particles 9 each coated with a protective film 10 is formed, and then the protective film molecules 11 of the adjacent fine particles 9 are reacted with each other by heating or light irradiation to convert the protective film molecules 11 to the organic semiconductor molecules 12 which connect the adjacent fine particles 9 to each other. As a result, the adjacent fine particles 9 are linked to each other with the organic semiconductor molecules 12 to form one layer of a network-type conductive path including the fine particles 9 and the organic semiconductor molecules 12. In this way, one channel layer 8 is formed. Therefore, this step is repeated several times to form the channel layer having a desired thickness.

The thickness of one channel layer 8 is substantially the same as the particle size (several mn) of the fine particles 9. When the fine particles 9 are composed of gold and have a particle size of about 10 nm, the channel layer 8 including ten laminated layers has a thickness of about 100 nm. In this case, the thickness of each of the source electrode 4 and the drain electrode 5 may be the 100 nm or more according to the thickness of the channel layer 8.

The channel layer 8 is formed by independently forming each of the aggregate layers, and thus the properties of the channel layer 8 may be controlled by changing the material and particle size of the fine particles 9 or the organic semiconductor molecules 12 for each aggregate layer or each plurality of the aggregate layers.

FIGS. 2A to 3G show a flow chart of a process for manufacturing the insulated-gate field-effect transistor shown in FIG. 1. The manufacturing process will be described below with reference to an example in which gold fine particles are used as the fine particles 9.

Step 1

Figure 2A:
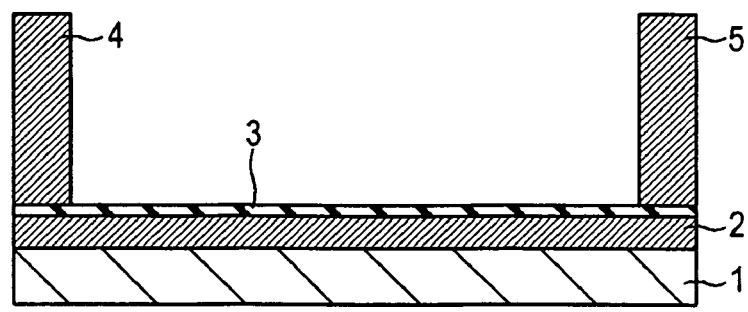
FIGS. 2A to 2D show a flow chart of a process for manufacturing the insulated-gate field-effect transistor shown in FIG. 1.
Figure 2B:
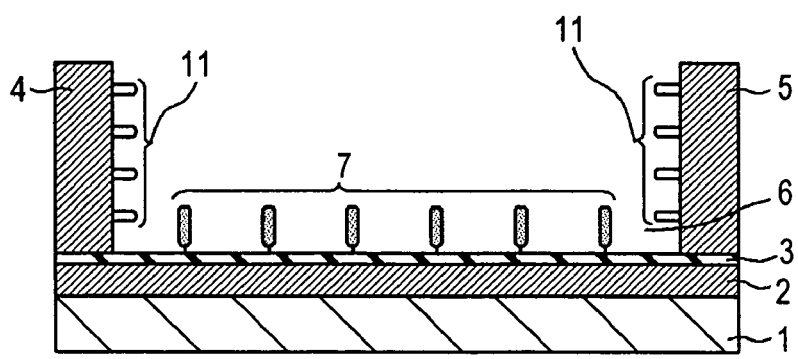

First, as shown in FIG. 2A, the gate electrode 2, the gate insulating film 3, the source electrode 4, and the drain electrode 5 are formed on the substrate 1 by a known method.

As the substrate 1, a silicon substrate, a plastic substrate of polyimide or polycarbonate, a glass substrate, a quartz substrate, or the like is used.

The gate electrode 2 is formed on the substrate 1 by vapor deposition of gold. As a material other than gold for the gate electrode 2, a conductive substance, such as a conductive polymer, platinum, aluminum, nickel, or titanium, or a combination thereof can be used. The gate electrode 2 can be formed by a lift-off method, a shadow mask method, a screen printing method, an ink-jet printing method, or the like. For example, when the substrate 1 is a highly doped silicon substrate and thus has sufficient conductivity, the substrate can be also used as the gate electrode without gold deposition.

Then, the gate insulating film 3 is formed by thermal oxidation, CVD, spin-coating, sputtering, dipping, casting, or the like. As a material for the gate insulating film 3, for example, silicon oxide, polymethyl methacrylate, spin-on-glass, silicon nitride, or a metal oxide high-dielectric insulating film, or a combination thereof can be used.

Next, the source electrode 4 and the drain electrode 5 are formed by vapor deposition of gold on the gate insulating film 3 with the other portion being masked. Examples of a material other than gold for the source electrode 4 and the drain electrode 5 include conductive substances such as palladium, platinum, chromium, nickel, and conductive polymers, and combinations thereof. The source electrode 4 and the drain electrode 5 are formed by lift-off method, a shadow mask method, a screen printing method, an ink-jet printing method, or the like.

Step 2

When the surface of the gate insulating film 3 has low affinity for the gold fine particles, the molecular solder layer 6 is formed for fixing only one layer of the gold fine particles 9 to the surface of the region in which the channel layer 8 is to be formed, before a gold fine particle layer is formed.

As the solder molecules 7 for fixing the gold fine particles 9, molecules having functional groups which can bond to the protective film molecules 11 bonding to the gold fine particles 9 or the fine particles 9 and functional groups which can bond to the gate insulating film 3 are used.

For example, when the fine particles 9 are composed of gold, and the molecular solder layer 6 is formed on the gate insulating film 3 composed of silicon oxide $SiO_2$, preferred examples of a compound for the solder molecules 7 include N-(2-aminoethyl)-3-aminopropylmethyldimethoxysilane, N-(2-aminoethyl)-3-aminopropoyltrimethoxysilane, N-(2-aminoethyl)-3-aminopropyltriethoxysilane, 3-aminopropyltrimethoxysilane, 3-aminopropyltriethoxysilane, 3-mercaptopropyltrimethoxysilane, and 3-mercaptopropyl methyldimethoxysilane. Furthermore, as a preparation for electrical bonding between the fine particles 9 and the source and drain electrodes 4 and 5, a layer of the protective film molecules 11 is formed on each of the surfaces of the source electrode 4 and the drain electrode 5. For this purpose, the substrate 1 is immersed in a solution of the protective film molecules 11 in ethanol at a concentration of several mM for 1 hour or more, washed with the solvent, and then dried.

Step 3

Figure 2C:
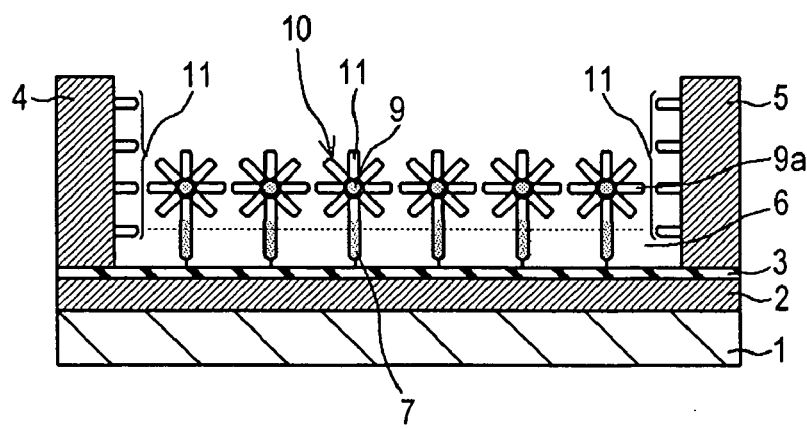

Next, as shown in FIG. 2C, the substrate 1 is immersed in a dispersion (concentration: several mM) of the gold fine particles 9 in a solvent such as toluene, chloroform, or the like for several minutes to several hours, and then the solvent is evaporated. As a result, the gold fine particles 9 are fixed on the surface of the molecular solder layer 6 on the substrate 1 to form the gold fine particle layer 9a including the gold fine particles 9 on the molecular solder layer 6. In this step, only one layer 9a of the gold fine particles 9 is bonded and fixed to the molecular solder layer 6. Excessive gold fine particles 9 not fixed to the molecular solder layer 6 are washed out.

The gold fine particle layer 9a may be formed by a casting process, a Langmuir-Blodgett (LB) process, or a stamping process instead of the above-described immersion process.

In the casting process, a dispersion of the gold fine particles 9 in a solvent such as toluene, chloroform, or the like is dropped on the substrate 1, and the solvent is slowly evaporated. As a result, the gold fine particle layer 9a is formed on the surface of the substrate 1. In this case, the concentration of the dispersion is previously adjusted so that only one gold fine particle layer is formed.

In the LB process, a dispersion of the gold fine particles 9 in a solvent such as toluene, chloroform, or the like is spread on a stationary surface of water to form a gold fine particle layer. Next, the gold fine particle layer is transferred to the substrate 1 by a water top-down method to form the gold fine particle layer 9a on the substrate 1.

In the stamping process, the gold fine particle layer formed on a surface of a solid or water by the casing or LB process is once transferred to a surface of polydimethylsiloxane and pressed like a stamp on the substrate 1 to transfer the gold fine particle layer 9a on the substrate 1.

The gold fine particles 9 are colloidal particles having a particle size of 10 nm or less. In order to stably disperse the gold fine particles in the solvent such as toluene, chloroform, or the like, the protective film molecules 11 are preferably adhered for preventing aggregation and precipitation of the gold fine particles so that each of the gold fine particles 9 is coated with the protective film 10. The gold fine particles 9 each coated with the protective film 10 are fixed on the molecular solder layer 6.

Each protective film molecule 11 is represented by the chemical formula, X—R—Y, and has the first functional group X strongly bonding to one of the gold fine particles 9 at one of the ends, and the second functional group Y at the other. By heating activation in next step 4, the second functional group Y of each protective film molecule 11 (X—R—Y) bonding to one of the gold fine particles 9 is subjected to condensation reaction with the second functional group Y of each protective film molecule 11 bonding to an adjacent one of the fine particles 9 to produce the organic semiconductor molecule 12 (X—R—Y'—R—X) which connects the two gold fine particles 9 to each other according to the above-described reaction formula.

Step 4

Figure 2D:
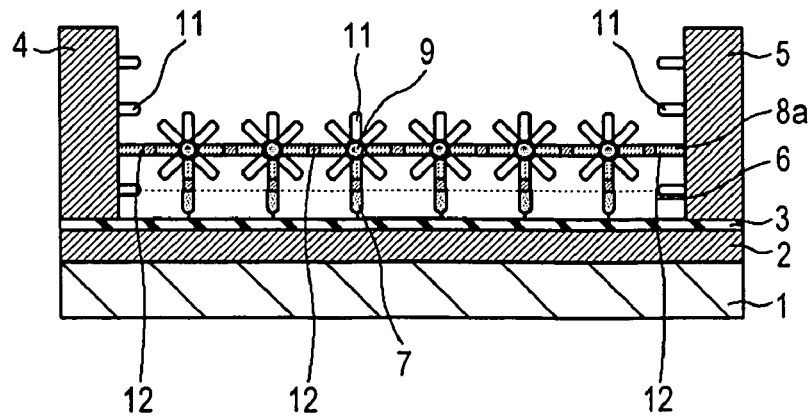

Next, as shown in FIG. 2D, the whole of the semiconductor device is uniformly heated to produce condensation reaction between the second functional groups Y of the protective film molecules 11 bonding to the adjacent gold fine particles 9. As a result, some of the protective film molecules 11 are converted to the organic semiconductor molecules 12 which connect the two gold fine particles 9. Since one gold fine particle 9 has links between the surface thereof and many surrounding gold fine particles 9 through the organic semiconductor molecules 12, the first channel layer 8 is formed, in which the gold fine particles 9 are linked in a network form with the organic semiconductor molecules 12. As the same time, the organic semiconductor molecules 12 are formed between the gold fine particles 9 and the source electrode 4 and the drain electrode 5, and thus the channel layer 8a is also electrically connected to the source and rain electrodes 4 and 5. Since many unreacted protective film molecules 11 remain on the surface of the channel layer 8a, the surface of the channel layer 8a can bond to the gold fine particles 9 which are then deposited thereon.

Step 5

Figure 3E:
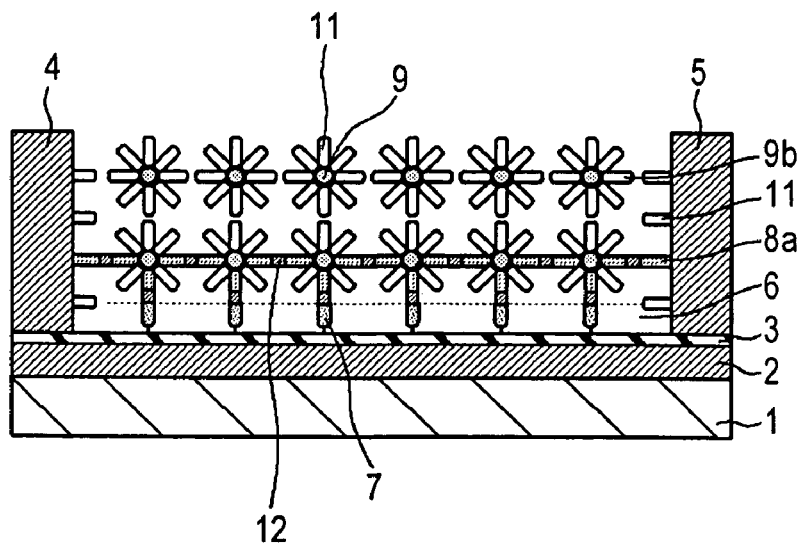
FIGS. 3E to 3G show a flow chart of the process for manufacturing the insulated-gate field-effect transistor shown in FIG. 1.

Next, as shown in FIG. 3E, like in Step 3, the substrate 1 is immersed in a dispersion of the gold fine particles 9 in a solvent such as toluene, chloroform, or the like for several minutes to several hours, and then the solvent is evaporated. As a result, the gold fine particles 9 are fixed and bonded to the surface of the first channel layer 8a to form the second gold fine particle layer 9b. Like in Step 3, the gold fine particles 9 are coated with protective films 10 for preventing aggregation of the fine particles 9, and applied to the channel layer 8a. Like in Step 3, the gold fine particle layer 9b may be formed by a casting process, a Langmuir-Blodgett (LB) process, or a stamping process.

Figure 3F:
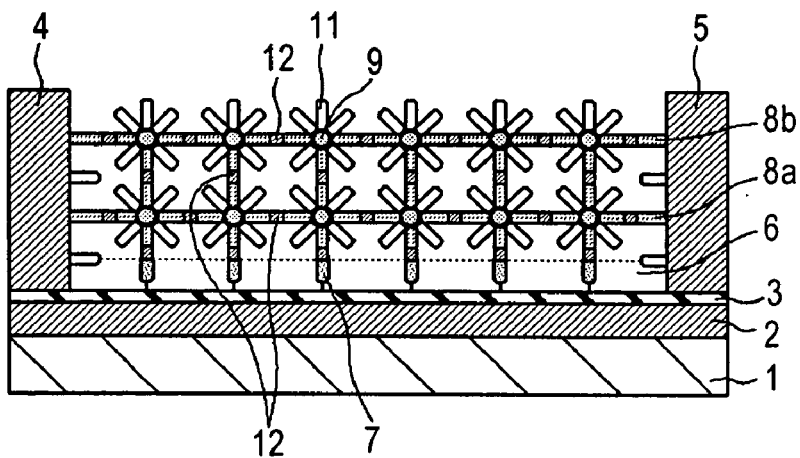
Figure 3G:
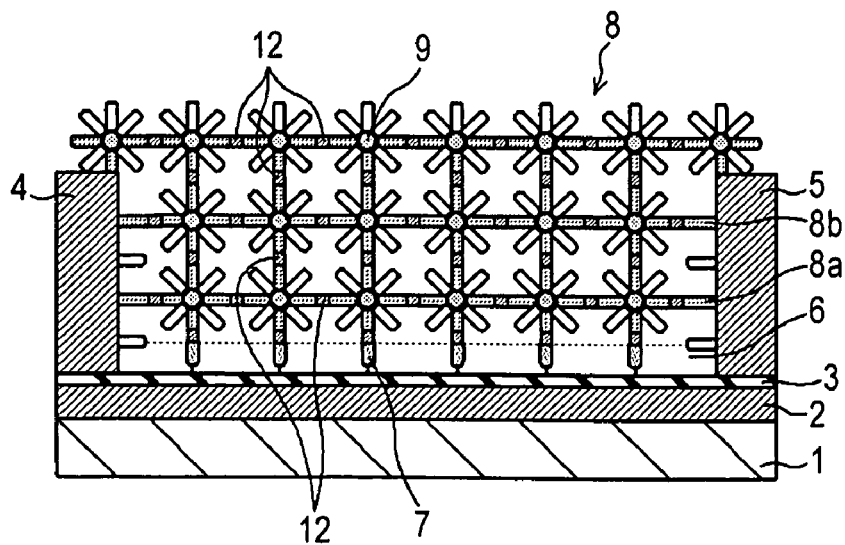

Next, as shown in FIG. 3F, like in Step 4, the whole of the semiconductor device is uniformly heated to induce condensation reaction between the second functional groups Y of the protective film molecules 11 bonding to the respective adjacent gold fine particles 9. As a result, some of the protective film molecules 11 (X—R—Y) are converted to the organic semiconductor molecules 12 (X—R—Y'—R—X) which connect the two gold fine particles 9 and connect the gold fine particles 9 and the source and drain electrodes 4 and 5. Thereby, the second channel layer 8b is formed, and the gold fine particles 9 in the first layer are linked to the gold fine particles 9 in the second layer. Consequently, the gold fine particles 9 in the first layer, which are linked to the same gold fine particle in the second layer, ate indirectly linked to each other through the same gold fine particle in the second layer, thereby forming three-dimensional linkage. Excessive gold fine particles 9 not bonding to the channel layer 8b are washed out. Since many unreacted protective film molecules 11 remain on the surface of the channel layer 8b, the surface of the channel layer 8b can bond to the gold fine particles 9 which are then deposited thereon.

Then, steps 5 and 6 are repeated several times to form a channel layer each time, thereby forming a channel layer in which a three-dimensional network conductive path is formed. The channel layer 8 having a desired thickness can be formed by appropriately selecting the number of repeats.

Figure 4:
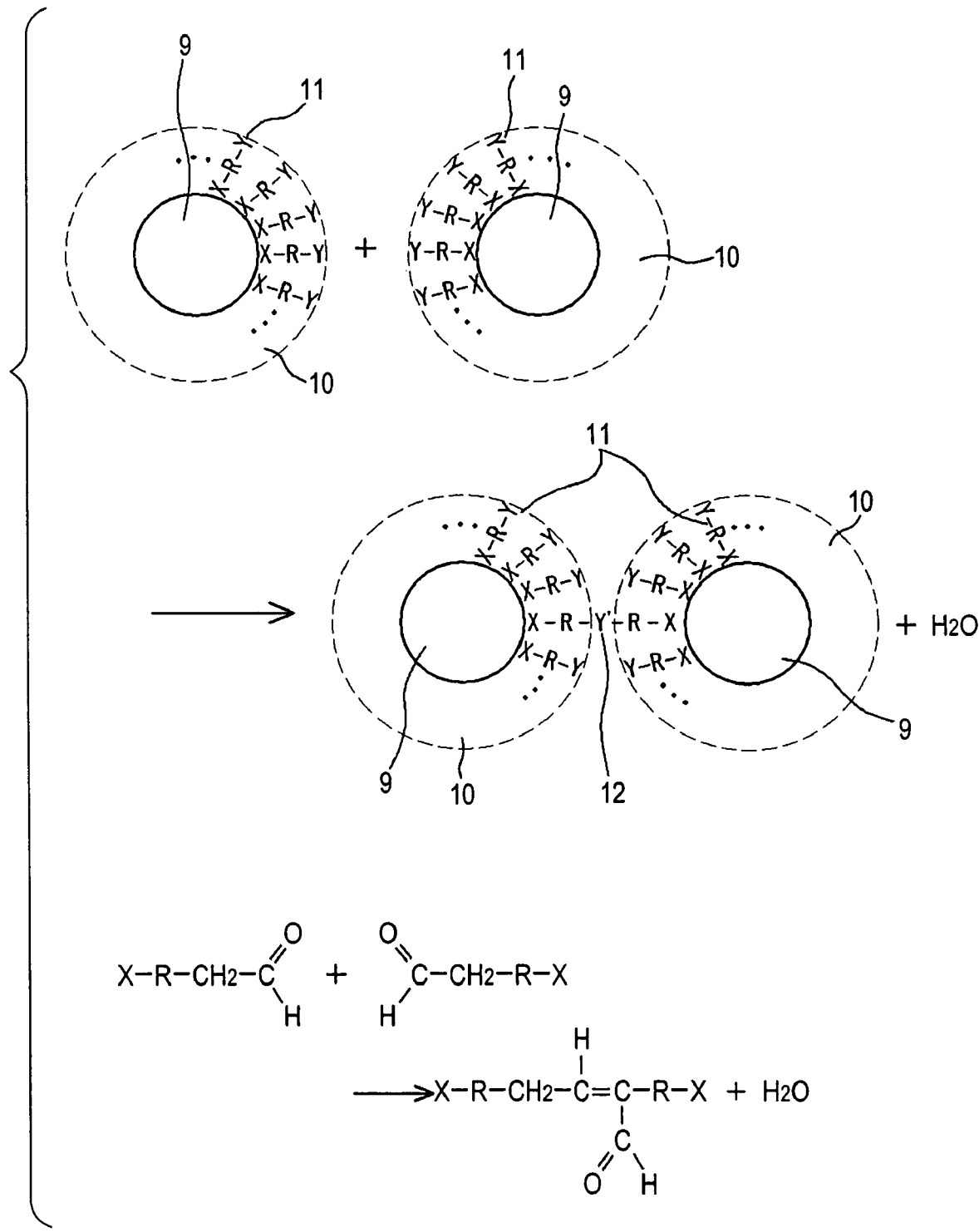
FIG. 4 is a view illustrating a process of producing an organic semiconductor molecule from protective film molecules.

FIG. 4 is a drawing illustrating a process in which the organic semiconductor molecules 12 are produced from the protective film molecules 11 so that the adjacent gold fine particles 9 are linked to each other with the organic semiconductor molecules 12 (X—R—Y'—R—X) according to the first embodiment of the present invention. FIG. 4 shows a reaction formula of aldol condensation in which the second functional group Y is an aldehyde group. Examples of similar reaction include Claisen condensation in which the functional group Y is an ester bond.

Figure 5A:
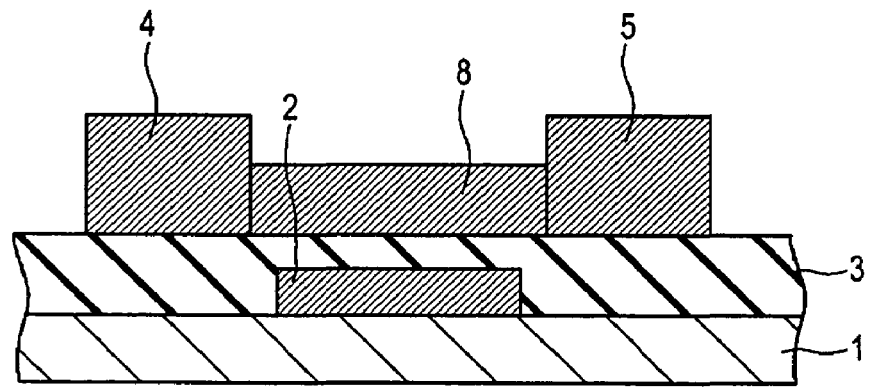
FIGS. 5A to 5C are sectional views showing respective device structures of insulated-gate field-effect transistors.
Figure 5B:
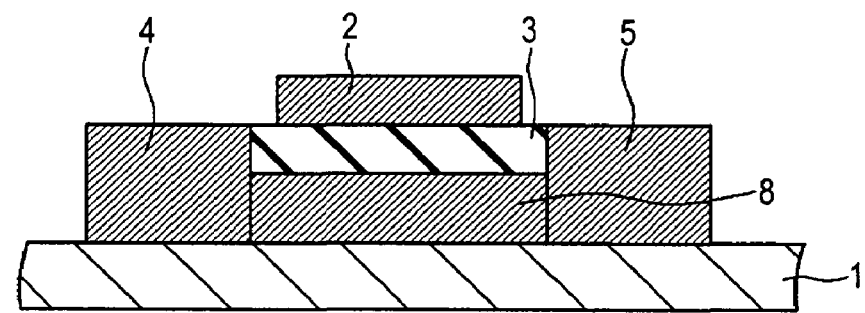
Figure 5C:
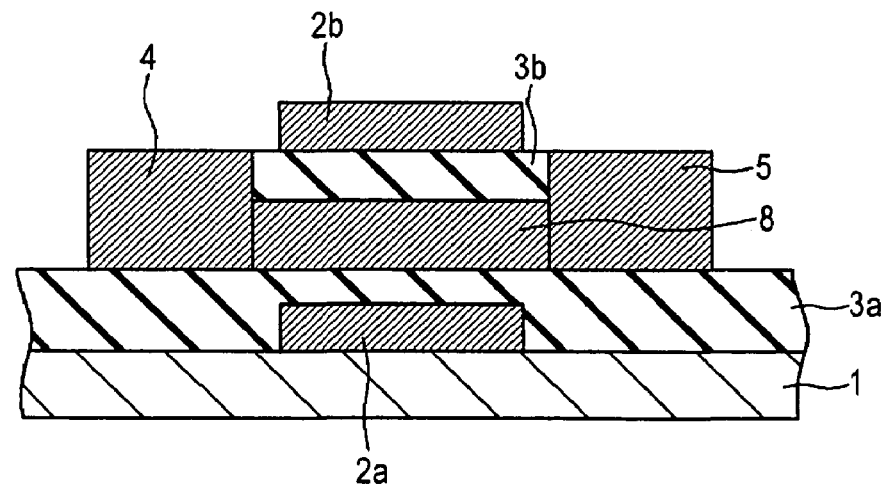

FIGS. 5A to 5C are sectional views showing respective device structures of insulated-gate field-effect transistors. An insulated-gate field-effect transistor according to the present invention may have any of the device structures. FIG. 5A shows the bottom-gate device structure shown by a schematic sectional view of FIG. 1, in which the gate electrode 2, the gate insulating film 3, the source electrode 4, and the drain electrode 5 are first formed, and then the channel layer 8 is formed between the source electrode 4 and the drain electrode 5. FIG. 5B is a sectional view showing a top-gate device structure in which a channel layer 8 is formed between a source electrode 4 and a drain electrode 5 which are previously formed, and then a gate insulating film 3 and a gate electrode 2 are formed thereon by vapor deposition or the like. FIG. 5C is a sectional view showing a dual-gate device structure in which a first gate electrode 2a and a first gate insulating film 3a, and a second gate electrode 2b and a second gate insulating film 3b are provided for effectively controlling the conductivity of a channel layer 8.

SECOND EMBODIMENT

In the second embodiment, the fine particles are linked to each other by another example of the chemical reaction between the protective film molecules to form the network-type conductive path.

Figure 6:
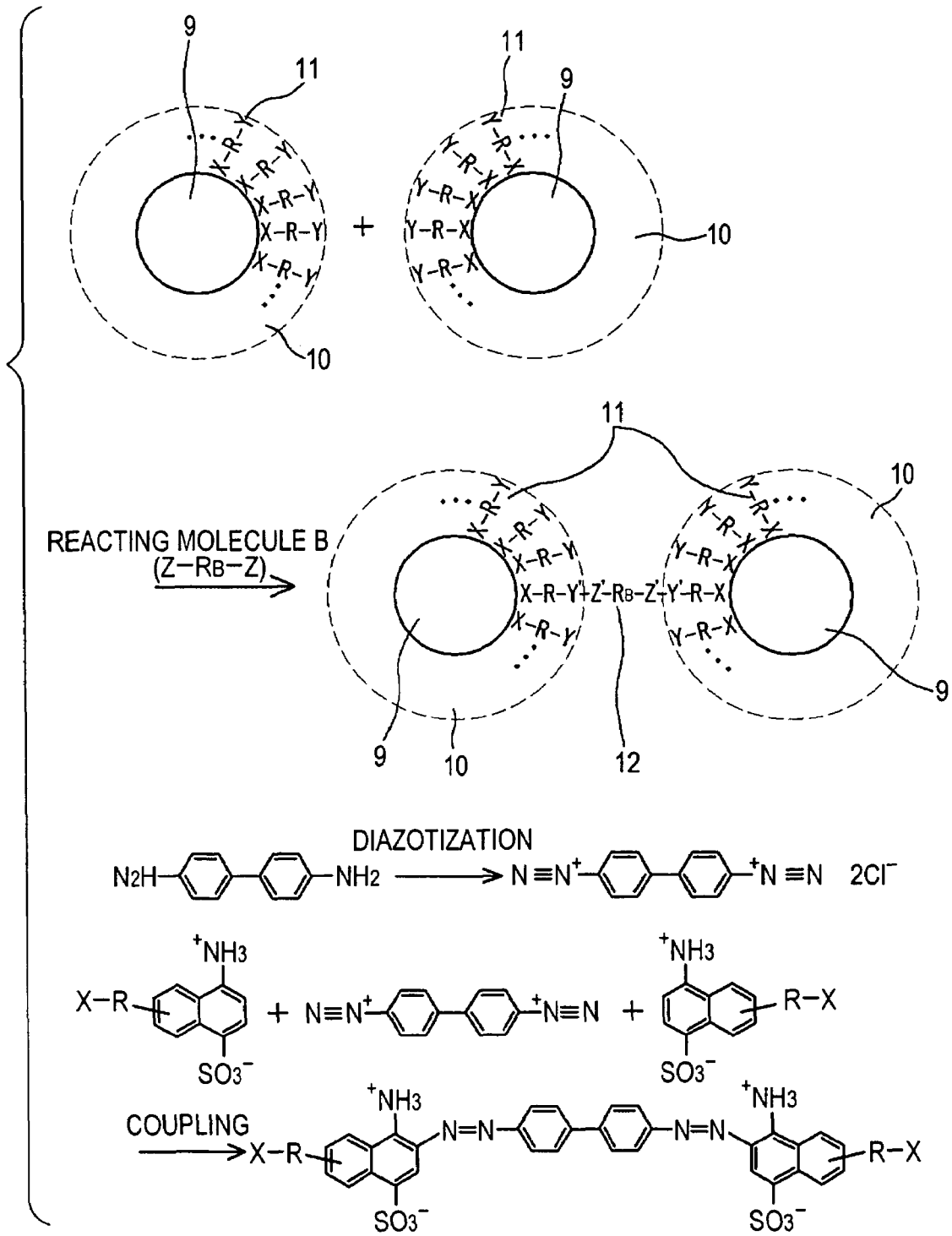
FIG. 6 is a view illustrating a process of producing an organic semiconductor molecule from protective film molecules according to a second embodiment of the present invention.

FIG. 6 is a drawing illustrating a process in which the organic semiconductor molecules 12 are produced from the protective film molecules 11 so that the adjacent fine particles 9 are linked to each other with the organic semiconductor molecules 12 (X—R—Y'—Z'—$R_B$—Z'—Y'—X) according to the second embodiment.

Each of the protective film molecules 11 has a first functional group X strongly bonding to a fine particle at one of the ends and a second functional group Y at the other end. On the other hand, a reacting molecule B has a structure represented by Z—RB—Z having third functional groups Z at two or more positions, which can form the above bonding to the second functional group Y.

By introducing the reacting molecule B, the second functional groups Y of the protective film molecules bonding to the respective adjacent fine particles respectively react with the two third functional groups of the reacting molecule B to produce the organic semiconductor molecules 12 which link the adjacent fine particles 9 to each other according to the following reaction formula:

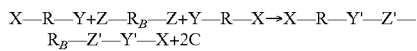

In the formula, Y' and Z' represent residues of Y and Z, respectively, after reaction, and C represents a small molecule such as released water or the like. Examples of such reaction include coupling reaction due to diazo coupling reaction between protective film molecules of an aminonaphthalene-sulfonic acid derivative using benzidine, and coupling reaction between protective film molecules having isocyanate groups using a diol compound, as shown in FIG. 6.

In the reaction, the molecular skeleton $R_B$ of the reacting molecule B preferably has a π-bond. After the formation of the bonding, the π-bond is more preferably conjugated with a π-bond present in the residue —Y'—Z'— or a π-bond present in R of each protective film molecule to form a π-bond conjugated system over the entirety of the organic semiconductor molecule.

THIRD EMBODIMENT

In the third embodiment, the fine particles are linked to each other by a further example of the chemical reaction between the protective film molecules to form the network-type conductive path.

Figure 7:
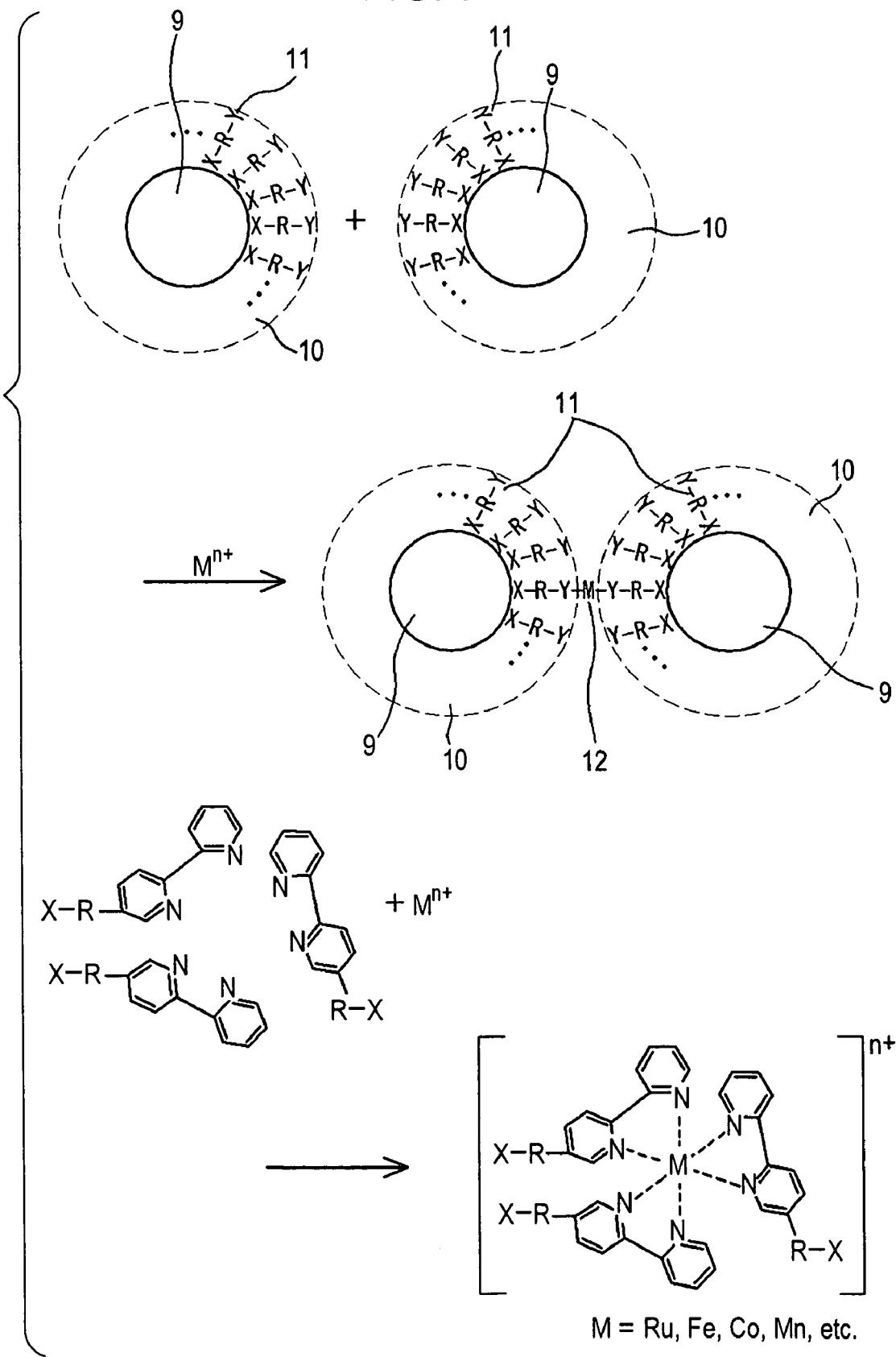
FIG. 7 is a view illustrating a process of producing an organic semiconductor molecule from protective film molecules according to a third embodiment of the present invention.

FIG. 7 is a drawing illustrating a process in which the organic semiconductor molecules 12 are produced from the protective film molecules 11 so that the adjacent fine particles 9 are linked to each other with the organic semiconductor molecules 12 according to the third embodiment.

Each of the protective film molecules 11 (X—R—Y) has a functional group X strongly bonding to one of the fine particles 9 at one of the ends and a second functional group Y which can coordinate to a metal ion $M^{n+}$ at the other end. As shown in FIG. 7, when the metal ion $M^{n+}$ is introduced, the second functional groups Y of the protective film molecules 11 bonding to the adjacent fine particles 9 coordinate to the same metal ion $M^{n+}$ to produce the organic semiconductor molecules 12 which link the adjacent fine particles 9 to each other.

FOURTH EMBODIMENT

In the fourth embodiment, the bonding is formed by reaction which does not form a new π-bond conjugated system at a bonding site, such as π-π stacking reaction, hydrogen bond forming reaction, or the like. In this embodiment, molecules having the properties of organic semiconductor molecules are preferably selected as the protective film molecules 11.

Figure 8:
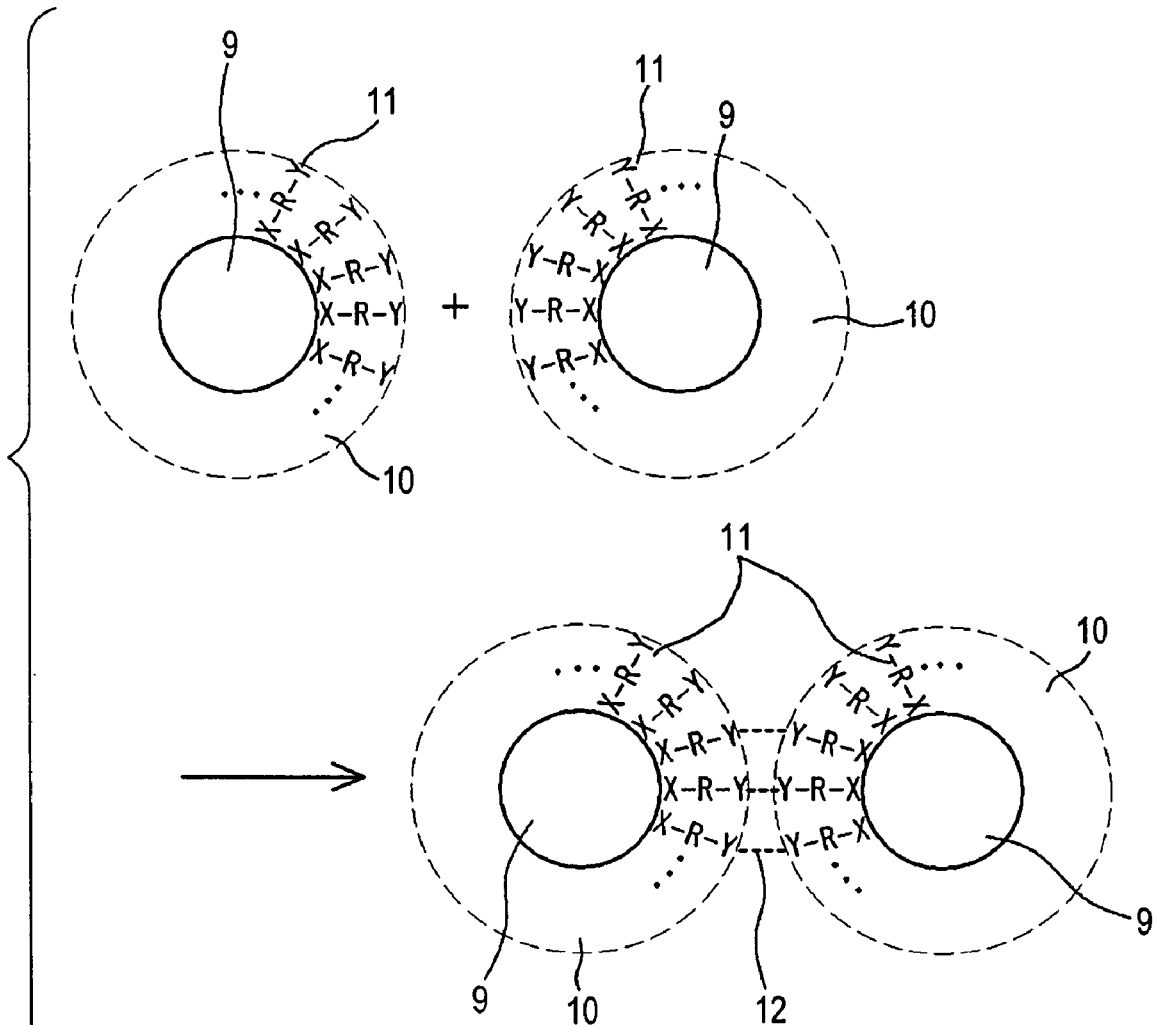
FIG. 8 is a view illustrating a process of producing an organic semiconductor molecule from protective film molecules according to a fourth embodiment of the present invention.
Figure 8:
Figure 8:
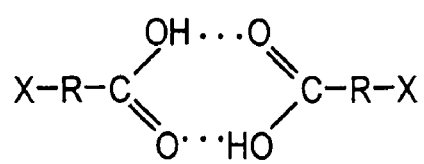
Figure 9A:
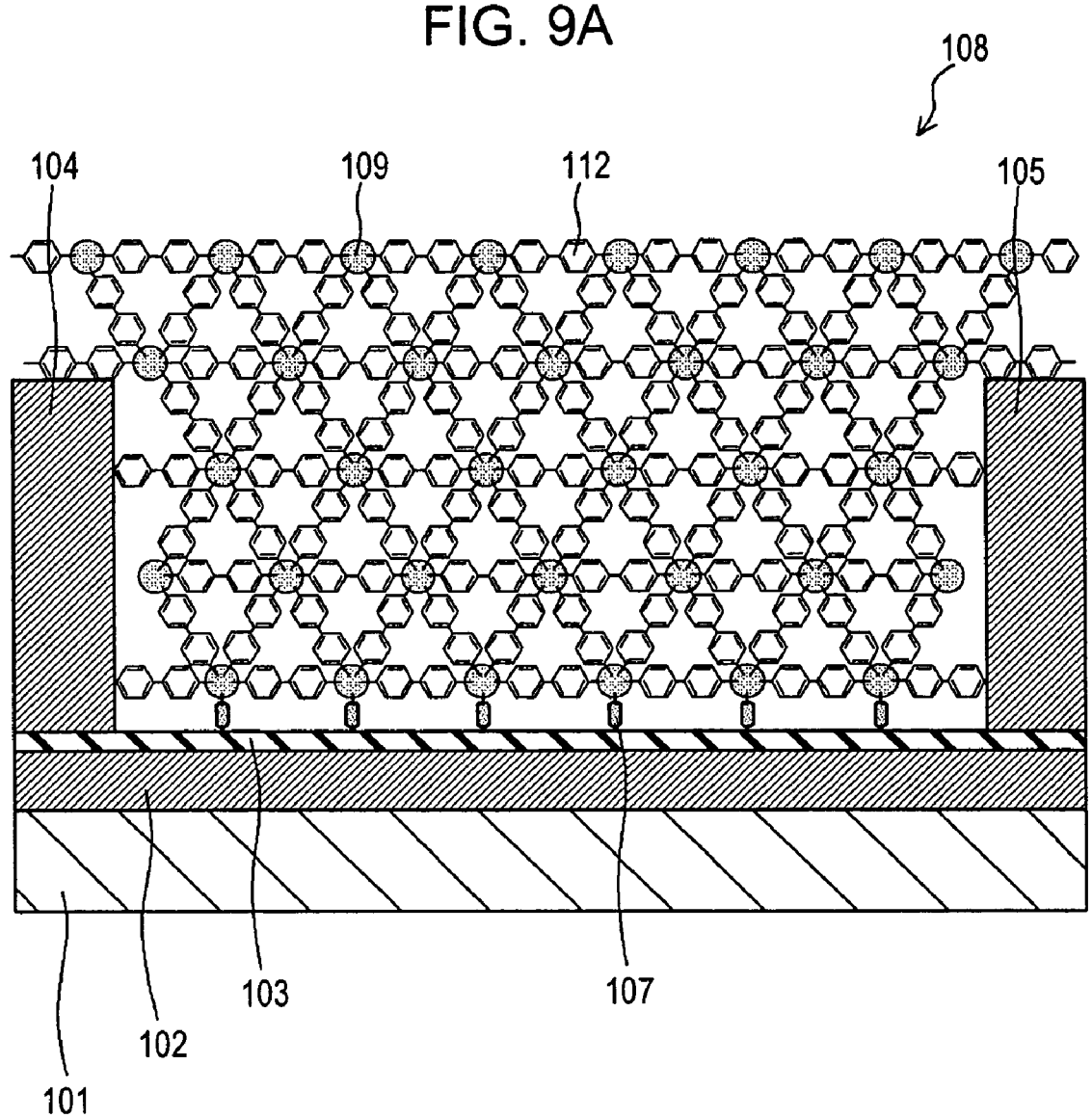
FIG. 9A is a sectional view of an insulated-gate field-effect transistor disclosed in Japanese Unexamined Patent Application Publication No. 2004-88090.
Figure 9B:
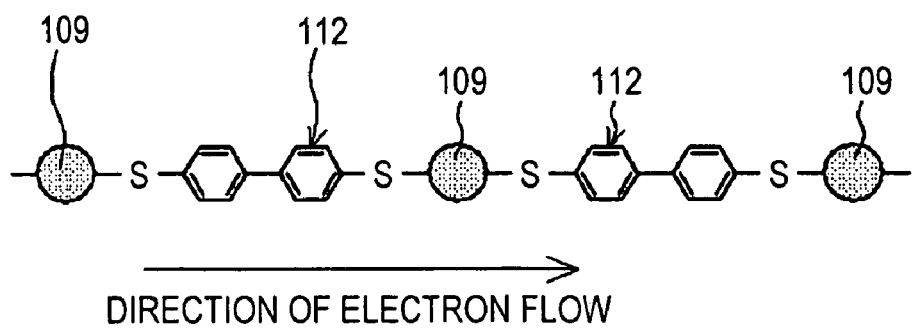
FIG. 9B is an enlarged view of a principal portion of the same.
Figure 10A:
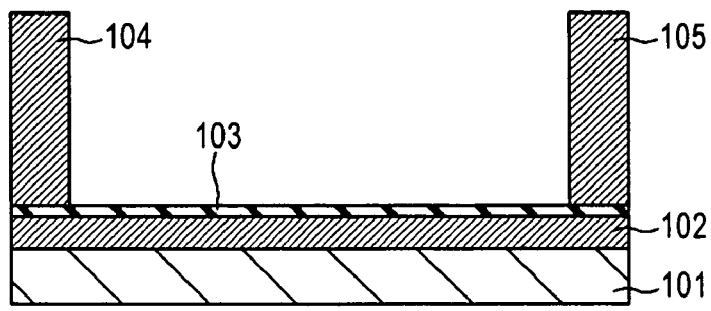
FIGS. 10A to 10D show a flow chart of a process for manufacturing the insulated-gate field-effect transistor shown in FIGS. 9A and 9B.
Figure 10B:
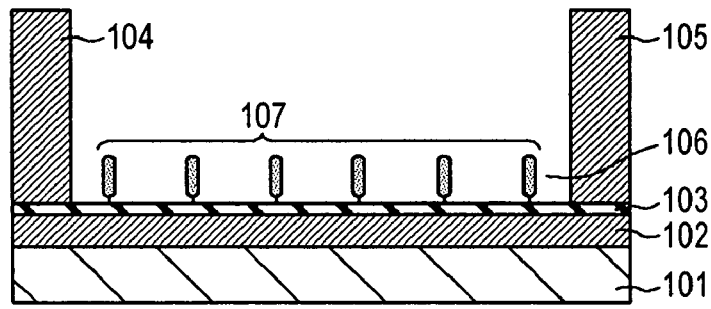
Figure 10C:
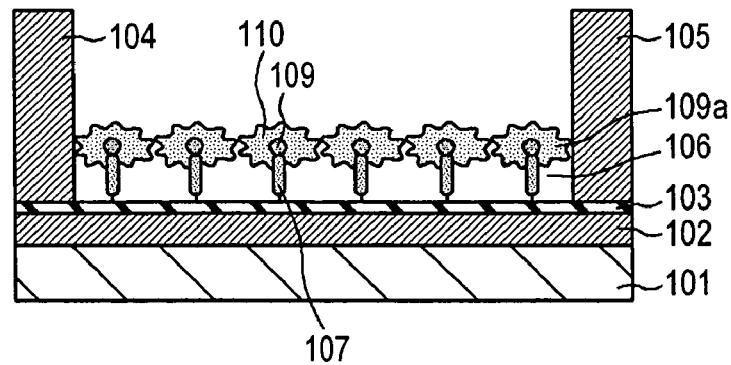
Figure 10D:
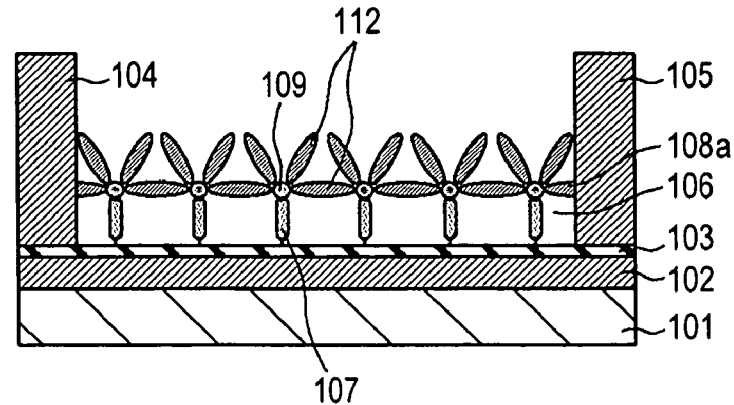
Figure 11E:
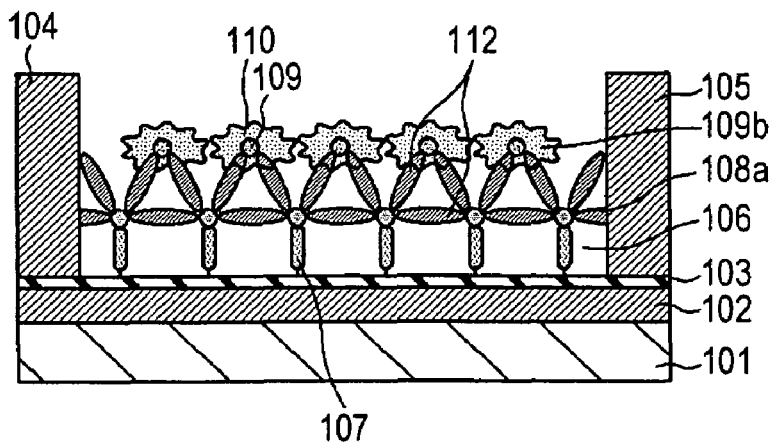
FIGS. 11E to 11G show a flow chart of the process for manufacturing the insulated-gate field-effect transistor shown in FIGS. 9A and 9B.
Figure 11F:
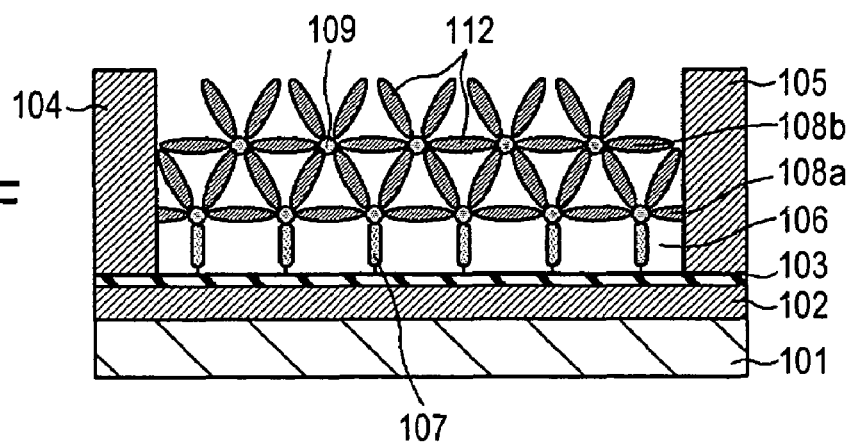
Figure 11G:
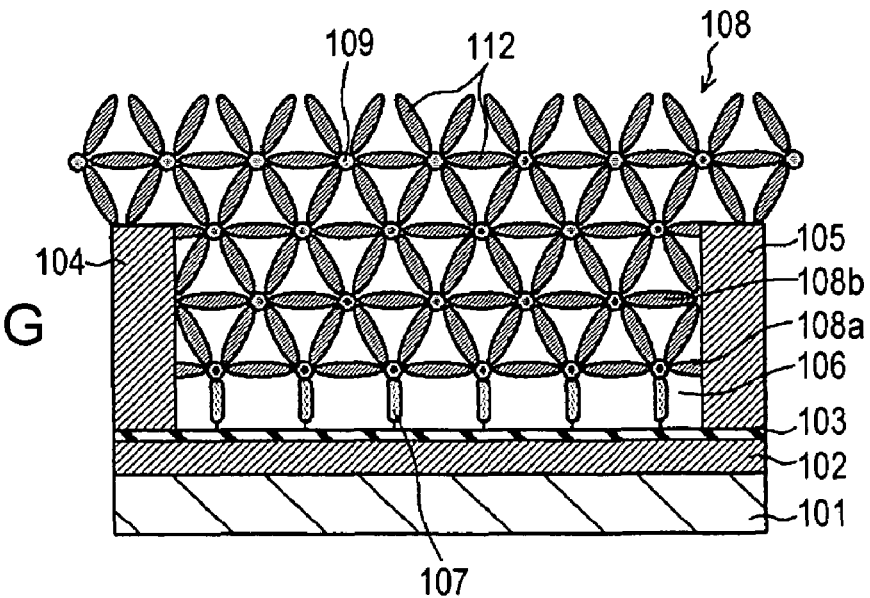

FIG. 8 is a drawing illustrating a process in which protective film molecular dimers 12 are produced from the protective film molecules 11 so that the adjacent fine particles 9 are linked to each other with the protective film molecule dimers 12 according to the fourth embodiment.

Each of the protective film molecules 11 (X—R—Y) has a functional group X strongly bonding to one of the fine particles 9 at one of the ends, and the protective film molecules 11 are in chemical and electrical contact with the fine particle 9. Also, each of the protective film molecules 11 has at least one second functional group Y which does not bond directly to the fine particle 9.

The second functional groups Y of the protective film molecules 11 bonding to the respective adjacent fine particles 9 bond to each other by electrostatic attraction, Van der Waalls force, hydrogen bond, or π-π stacking without forming a covalent bond or coordination bond due to chemical reaction, to produce the organic semiconductor molecule dimmers 12 which link the adjacent fine particles 9 to each other (M. Kanehara et al., J. Am. Chem. Soc., 125, P. 8708 (2003)).

In this case, the solution used has a pH and salt concentration which are controlled so as to prevent aggregation of the fine particles in a colloidal solution. In the system used, the interaction between protective film molecules is enhanced by solvent evaporation and washing of the substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A semiconductor device comprising:
   a conductive path having a conductivity that is controllable by an electric field, the conductive path being defined by a molecular network of particles and molecules including:
   a plurality of fine particles having a particle size of about 10 nm or less;
   a plurality of protective film molecules wherein each of the protective film molecules are bonded to one of the fine particles; and
   a plurality of organic semiconductor molecules wherein the organic semiconductor molecules and the fine particles are alternatively bonded thereby defining the molecular network;
   wherein the organic semiconductor molecules have an organic semiconductor functional group selected from the group consisting of a thiol group (—SH), an amino group (—NH$_2$), an isocyano group (—NC), a thioacetoxyl group (—SCOCH$_3$), a carboxyl group (—COOH), and combinations thereof;

wherein the organic semiconductor functional group is bonded to the fine particles; and wherein the organic semiconductor molecules are a compound selected from the group consisting of

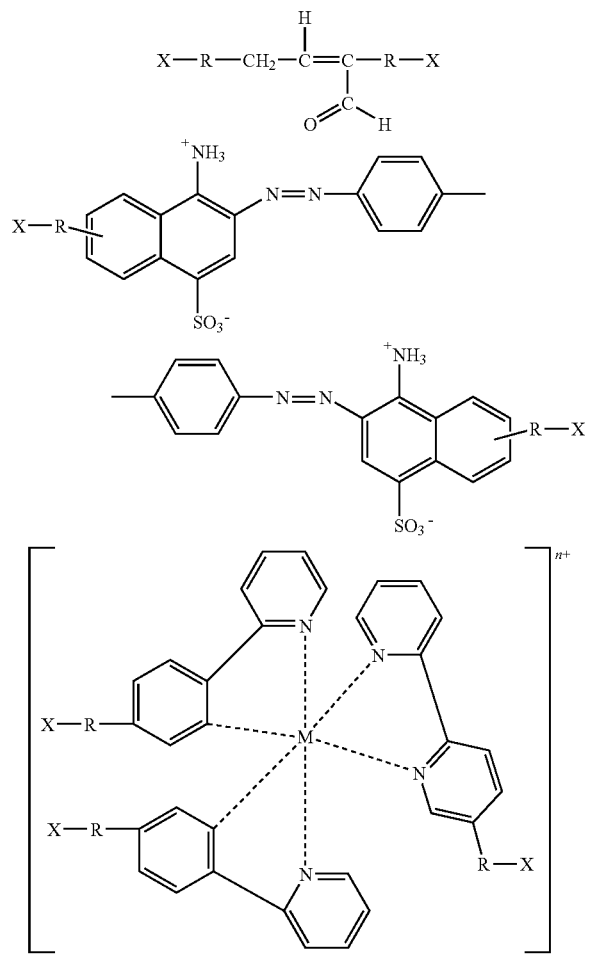

M = Ru, Fe, Co, Mn, etc.

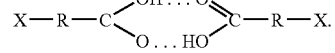

2. The semiconductor device according to claim 1, wherein each of the protective film molecules has a molecular skeleton with a π-bond conjugated system.

3. The semiconductor device according to claim 1, wherein the protective film molecules have a protective film functional group selected from the group consisting of a thiol group (—SH), an amino group (—NH$_2$), an isocyano group (—NC), a thioacetoxyl group (—SCOCH$_3$), a carboxyl group (—COOH), and combinations thereof.

4. The semiconductor device according to claim 1, wherein the fine particles are selected from the group consisting of gold, silver, platinum, cadmium sulfide, cadmium, selenide, silicon, and combinations thereof.

5. The semiconductor device according to claim 1, further comprising an aggregate of the fine particles and the organic semiconductor molecules, wherein the aggregate includes one layer or a plurality of layers of the fine particles and the organic semiconductor molecules, and wherein the aggregate forms the conductive path.

6. The semiconductor device according to claim 1, further comprising an underlying layer having high adhesiveness to the fine particles, wherein a layer of the fine particles is formed on the underlying layer.

7. The semiconductor device according to claim 1, wherein the semiconductor device is an insulated-gate field-effect transistor including a channel region having the conductive path, and source and drain electrodes provided on both sides of the channel region, and a gate electrode provided between the electrodes.

\* \* \* \* \*